United States Patent
Kang et al.

(10) Patent No.: US 9,024,921 B2
(45) Date of Patent: May 5, 2015

(54) ORGANIC LIGHT EMITTING DIODE DISPLAY

(75) Inventors: Ki-Nyeng Kang, Yongin (KR); Kie Hyun Nam, Yongin (KR); Young-Hee Nam, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 371 days.

(21) Appl. No.: 13/481,718

(22) Filed: May 25, 2012

(65) Prior Publication Data

US 2013/0033465 A1 Feb. 7, 2013

(30) Foreign Application Priority Data

Aug. 2, 2011 (KR) ........................ 10-2011-0077108

(51) Int. Cl.
*G06F 3/038* (2013.01)
*H01L 51/52* (2006.01)
*H01L 27/32* (2006.01)

(52) U.S. Cl.
CPC ......... *H01L 51/5259* (2013.01); *H01L 27/3276* (2013.01)

(58) Field of Classification Search
CPC .................................................. H01I 51/5259
See application file for complete search history.

(56) References Cited

U.S. PATENT DOCUMENTS

| | | | |
|---|---|---|---|
| 8,552,643 B2* | 10/2013 | Yoshinaga | 313/512 |
| 2002/0024096 A1* | 2/2002 | Yamazaki et al. | 257/359 |
| 2003/0038913 A1* | 2/2003 | Choo | 349/149 |
| 2003/0094615 A1* | 5/2003 | Yamazaki et al. | 257/72 |
| 2005/0184927 A1* | 8/2005 | Kwak | 345/45 |
| 2007/0034875 A1* | 2/2007 | Yamazaki et al. | 257/59 |
| 2008/0231175 A1* | 9/2008 | Sung et al. | 313/504 |
| 2010/0062553 A1* | 3/2010 | Sung et al. | 438/28 |
| 2012/0112212 A1* | 5/2012 | Kim | 257/88 |

FOREIGN PATENT DOCUMENTS

| | | |
|---|---|---|
| JP | 2005-011794 A | 1/2005 |
| JP | 2011-003285 A | 1/2011 |
| KR | 10-2010-0128459 | 12/2010 |
| KR | 10-2011-0005593 | 1/2011 |

* cited by examiner

*Primary Examiner* — Kent Chang
*Assistant Examiner* — Benjamin Morales Fernandez
(74) *Attorney, Agent, or Firm* — Christie, Parker & Hale, LLP

(57) ABSTRACT

An organic light emitting diode (OLED) display including: a substrate including a pixel area; a peripheral area enclosing the pixel area; a gate line; a data line; corresponding driving lines; a pixel electrode; an organic light emitting layer; a common electrode; and a getter formed at the peripheral area and partially overlapping the common electrode, wherein the driving lines overlapping the getter have a plurality of openings filled with the getter such that the getter amount may be increased, thereby increasing the moisture absorption amount.

13 Claims, 9 Drawing Sheets

ORGANIC LIGHT EMITTING DIODE DISPLAY

CROSS-REFERENCE TO RELATED APPLICATION

This application claims priority to and the benefit of Korean Patent Application No. 10-2011-0077108 filed in the Korean Intellectual Property Office on Aug. 2, 2011, the entire content of which is incorporated herein by reference.

BACKGROUND

1. Field

The described technology relates generally to an organic light emitting diode (OLED) display.

2. Description of Related Art

An organic light emitting diode (OLED) display includes two electrodes and an organic emission layer disposed therebetween, and electrons injected from one electrode and holes injected from the other electrode are coupled with each other on the organic emission layer to form excitons. The excitons emit light while emitting energy.

The organic light emitting diode (OLED) display includes a display substrate including an organic emission layer, and an encapsulation substrate covering the display substrate. A sealant is located around a periphery of the display substrate and the encapsulation substrate to attach the display substrate to the encapsulation substrate, and to seal them together. To protect the organic light emitting diode (OLED) display from moisture and/or oxides, a getter is located between a pixel area where the organic emission layer is located, and the sealant.

However, when the amount of the getter is increased to improve moisture penetration prevention, a cell gap between the display substrate and the encapsulation substrate is also increased. When the cell gap is increased, adhesion between the display substrate and the encapsulation substrate may be deteriorated, such that there is a limit to how much the cell gap may be increased.

To prevent the increase of the cell gap when increasing the amount of the getter, the glass substrate can be etched to increase the amount of the getter located between the encapsulation substrate and display substrate; however, this adds an additional etch process and cost.

The above information disclosed in this Background section is only for enhancement of understanding of the background of the described technology and therefore it may contain information that does not form the prior art that is already known in this country to a person of ordinary skill in the art.

SUMMARY

The described technology provides an organic light emitting diode (OLED) display effectively preventing the penetration of moisture.

An organic light emitting diode (OLED) display according to an exemplary embodiment includes: a substrate including a pixel area at which a pixel for emitting light is located, and a peripheral area around the pixel area; a gate line located in the pixel area; a data line insulated from and crossing the gate line; a data driving line located in the peripheral area and being located at the same layer as the data line; a pixel electrode coupled to the data line; an organic light emitting layer on the pixel electrode; a common electrode on the organic light emitting layer; and a getter at the peripheral area and partially overlapping the common electrode, wherein the data driving line overlapping the getter has a plurality of data openings filled with the getter.

A gate insulating layer and an interlayer insulating layer may be sequentially arranged between the substrate and the data driving line. The gate insulating layer and the interlayer insulating layer may have a plurality of gate insulating layer openings and a plurality of interlayer insulating layer openings overlapping the plurality of data openings.

A protective layer may be on the data driving line, and the protective layer may have a plurality of protective layer openings overlapping the plurality of data openings.

A pixel defining layer may be on the protective layer, and the pixel defining layer may have a plurality of pixel defining layer openings overlapping the plurality of data openings.

A pixel defining layer may be on the data driving line, and the pixel defining layer may have a plurality of protective layer openings overlapping the plurality of data openings.

The data driving line may be a driving voltage line.

The organic light emitting diode (OLED) display may further include an assistance gate metal positioned between the gate insulating layer and the interlayer insulating layer and overlapping the data driving line, and the assistance gate metal may have a plurality of gate openings overlapping the plurality of data openings.

The organic light emitting diode (OLED) display may further include a gate driving line in the peripheral area at the same layer as the gate line. The gate driving line may overlap the getter and may have a plurality of gate openings filled with the getter.

A gate insulating layer may be between the substrate and the gate driving line, and the gate insulating layer may have a plurality of gate insulating layer openings overlapping the plurality of gate openings.

An interlayer insulating layer and a protective layer may be sequentially arranged on the gate driving line, and the interlayer insulating layer and the protective layer respectively may have a plurality of interlayer insulating layer openings and a plurality of protective layer openings overlapping the plurality of gate openings.

A pixel defining layer may be on the protective layer, and the pixel defining layer may have a plurality of pixel defining layer openings overlapping the plurality of gate openings.

The gate driving line may be a driving voltage line.

According to an exemplary embodiment, the getter fills in a plurality of getter openings. The plurality of getter openings includes, for example, the plurality of pixel defining layer openings, the plurality of protective layer openings, the plurality of data openings, the plurality of interlayer insulating layer openings, and the plurality of gate insulating layer openings. The getter openings have a suitable depth, e.g., a predetermined depth, such that the getter amount may be increased, thereby increasing the moisture absorption amount.

BRIEF DESCRIPTION OF THE DRAWINGS

Example embodiments of the present invention will be more clearly understood from the following detailed description taken in conjunction with the accompanying drawings.

FIG. 1 is a top plan view of an organic light emitting diode (OLED) display according to the first exemplary embodiment.

FIG. 2 is a layout view of three neighboring pixels in a pixel area of an organic light emitting diode (OLED) display according to the first exemplary embodiment.

FIG. 3 is a cross-sectional view of the organic light emitting diode (OLED) display taken along the line II-II of FIG. 2.

FIG. 4 is an enlarged layout view of a portion A of a peripheral area of the organic light emitting diode (OLED) display of FIG. 1.

FIG. 5 is a cross-sectional view taken along the line V-V of FIG. 4.

FIG. 6 is an enlarged layout view of a portion of a peripheral area of an organic light emitting diode (OLED) display according to the second exemplary embodiment.

FIG. 7 is a cross-sectional view taken along the line VII-VII of FIG. 6.

FIG. 8 is an enlarged layout view of a portion of a peripheral area of an organic light emitting diode (OLED) display according to the third exemplary embodiment.

FIG. 9 is a cross-sectional view taken along the line IX-IX of FIG. 8.

FIG. 10 is a cross-sectional view of a peripheral area of an organic light emitting diode (OLED) display according to the fourth exemplary embodiment.

DETAILED DESCRIPTION OF THE EMBODIMENTS

Figure 1:
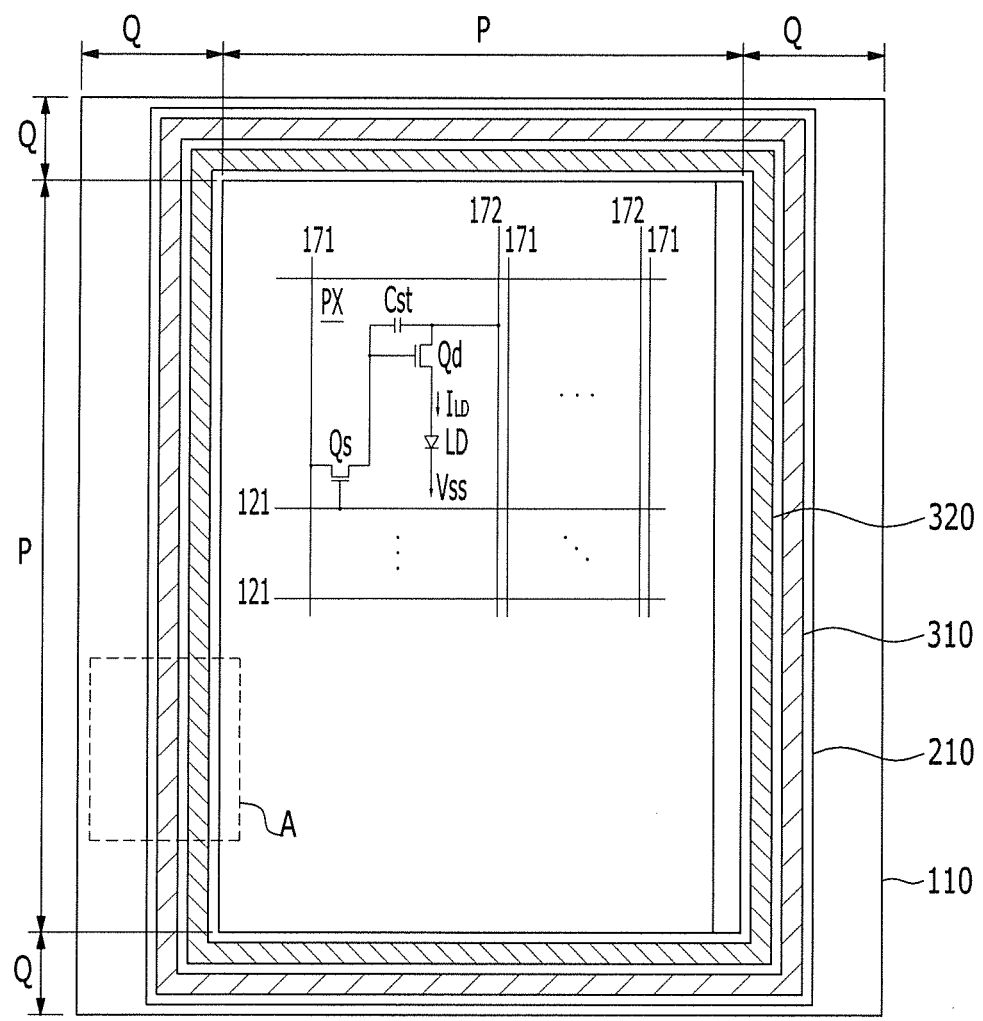
FIGS. 1 to 10 represent non-limiting, example embodiments as described herein.

Exemplary embodiments will be described more fully hereinafter with reference to the accompanying drawings. As those skilled in the art would realize, the described embodiments may be modified in various ways, all without departing from the spirit or scope of the present invention.

Descriptions of parts not related to the exemplary embodiments are omitted, and like reference numerals designate like elements throughout the specification.

In the drawings, the thickness of layers, films, panels, regions, etc., are exaggerated for clarity. It will be understood that when an element such as a layer, film, region, or substrate is referred to as being "on" another element, it can be directly on the other element or one or more intervening elements may also be present.

Thus, an organic light emitting diode (OLED) display according to a first exemplary embodiment will be described with reference to FIG. 1.

FIG. 1 is a top plan view of an organic light emitting diode (OLED) display according to the first exemplary embodiment.

Referring to FIG. 1, an organic light emitting diode (OLED) display according to the first exemplary embodiment includes a display substrate 110 including a plurality of pixels, an encapsulation substrate 210 covering the display substrate 110, and a sealant 310 disposed along the edges of the display substrate 110 and the encapsulation substrate 210, wherein the sealant 310 seals the display substrate 110 and the encapsulation substrate 210.

The display substrate 110 is divided into a pixel area P, where pixels emit light, and a peripheral area Q around, e.g., surrounding or enclosing, the pixel area P. A getter 320 for absorption of moisture penetrating from the outside is disposed along the sealant 310 in the peripheral area Q between the sealant 310 and the pixel area P. The getter 320 may increase the life-span of the organic light emitting diode (OLED) display, and may be a liquid getter.

The pixel area P includes a plurality of signal lines 121, 171, and 172, and a plurality of pixels PX connected thereto and arranged in an approximate matrix.

The signal lines include a plurality of gate signal lines 121 for transmitting gate signals (or scanning signals), a plurality of data lines 171 for transmitting data signals, and a plurality of driving voltage lines 172 for transmitting a driving voltage.

The gate signal lines 121 extend substantially in a row direction and are substantially parallel to each other. The data lines 171 and the driving voltage lines 172 extend substantially in a column direction and are substantially parallel to each other.

Each pixel PX includes a switching thin film transistor Qs, a driving thin film transistor Qd, a storage capacitor Cst, and an organic light emitting diode (OLED) LD.

The switching thin film transistor Qs includes a control terminal coupled to the gate line 121, an input terminal coupled to the data line 171, and an output terminal coupled to the driving thin film transistor Qd. The switching thin film transistor Qs transmits the data signal applied to data line 171 to the driving thin film transistor Qd in response to the scan signal applied to the gate line 121.

The driving thin film transistor Qd includes the control terminal coupled to the switching thin film transistor Qs, the input terminal coupled to the driving voltage line 172, and the output terminal coupled to the organic light emitting element LD. The driving transistor Qd drives an output current ILD having a magnitude depending on the voltage between the control terminal and the output terminal thereof.

The capacitor Cst is coupled between the control terminal and the input terminal of the driving transistor Qd. The capacitor Cst stores a data signal applied to the control terminal of the driving transistor Qd and maintains the data signal after the switching transistor Qs turns off.

The organic light emitting element LD may be an organic light emitting diode.

The organic light emitting element LD has an anode coupled to the output terminal of the driving transistor Qd, and a cathode coupled to a common voltage Vss. The organic light emitting element LD emits light having an intensity depending on an output current ILD of the driving transistor Qd, thereby displaying images.

The switching thin film transistor Qs and the driving thin film transistor Qd may be n-channel field effect transistors (FET). However, at least one of the switching thin film transistor Qs and the driving thin film transistor Qd may be a p-channel field effect transistor. Also, the connection relation of the thin film transistors Qs and Qd, the capacitor Cst, and the organic light emitting diode (OLED) LD may be changed.

Next, a detailed structure of the organic light emitting diode (OLED) display shown in FIG. 1 will be described with reference to FIGS. 2 to 5 as well as FIG. 1.

Figure 2:
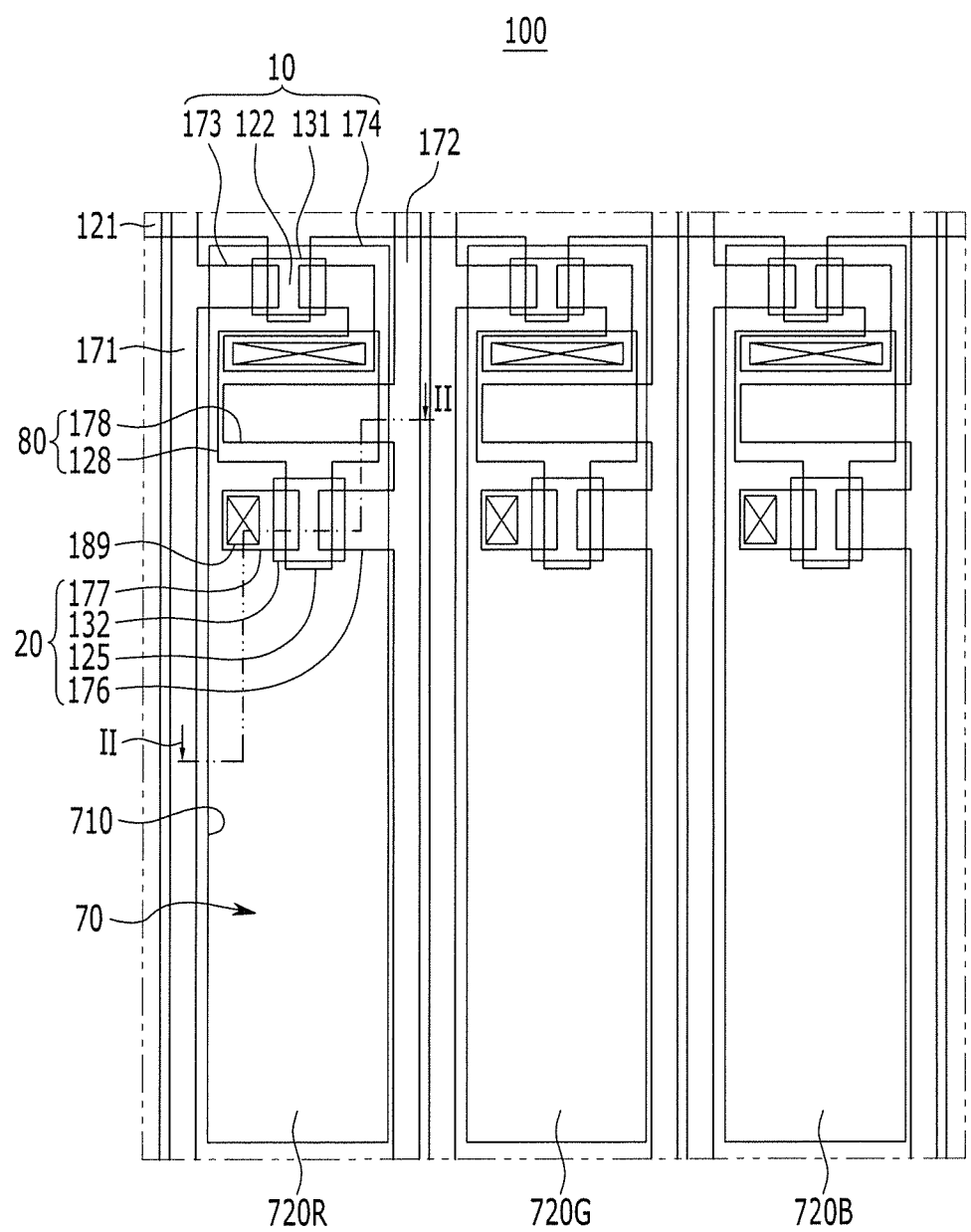
Figure 3:
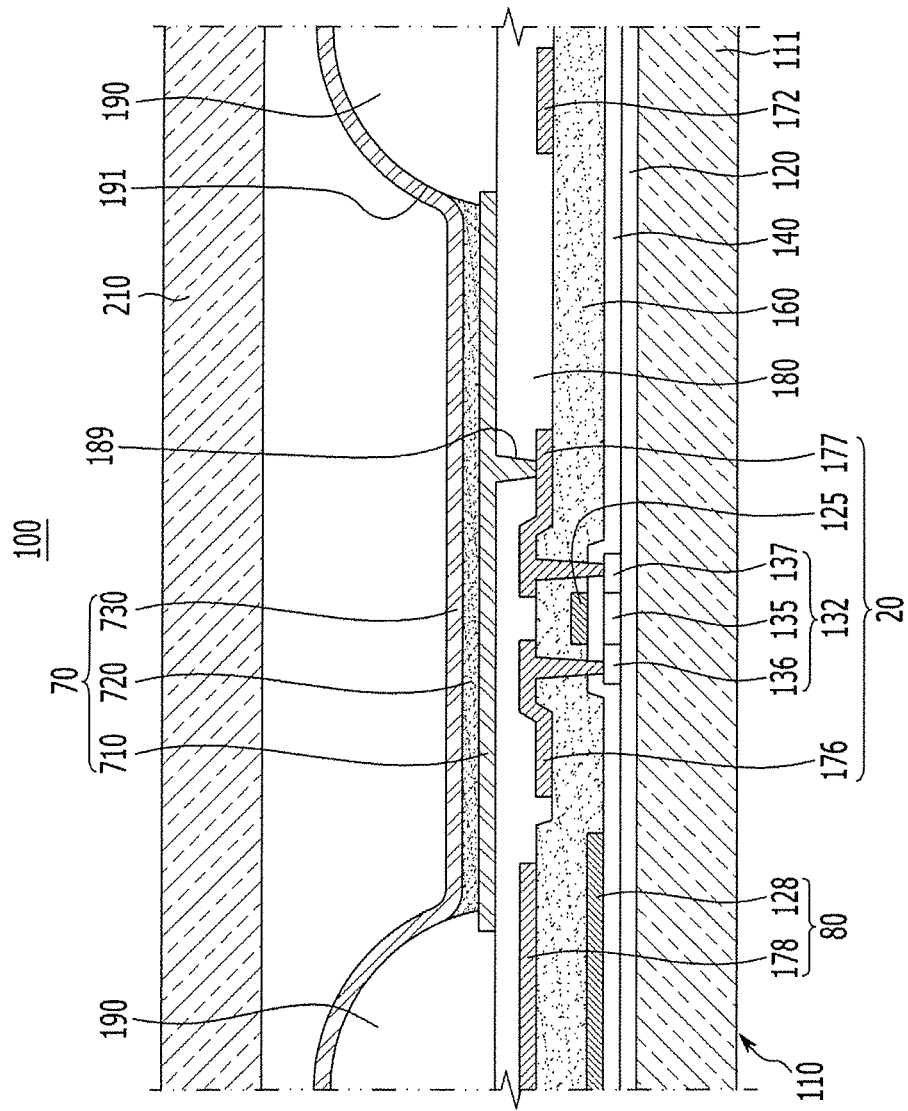
Figure 4:
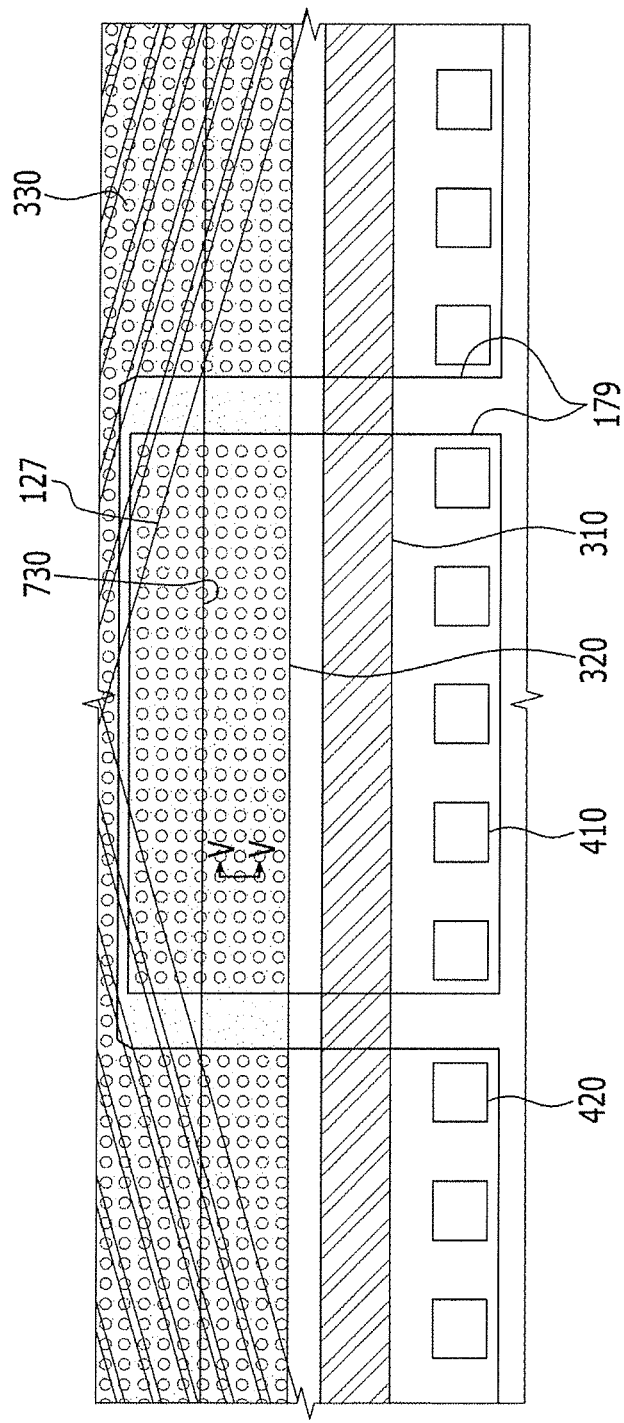
Figure 5:
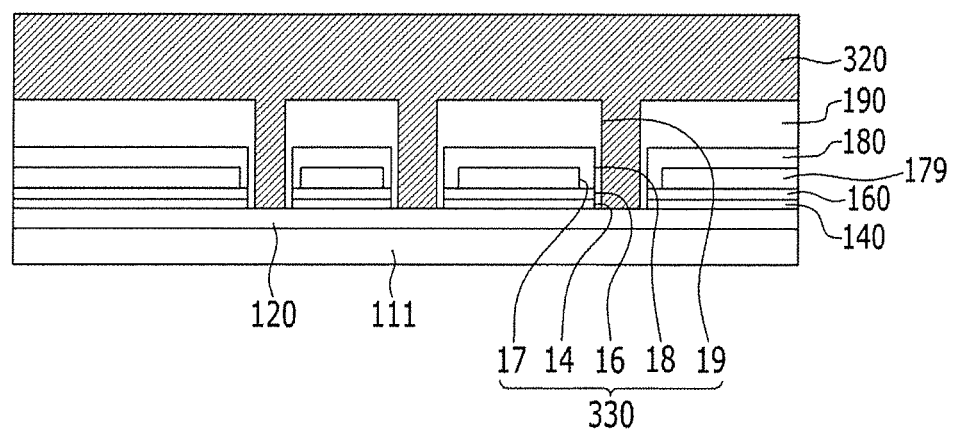

FIG. 2 is a layout view of three neighboring pixels in a pixel area of an organic light emitting diode (OLED) display according to the first exemplary embodiment. FIG. 3 is a cross-sectional view of the organic light emitting diode (OLED) display taken along the line II-II of FIG. 2. FIG. 4 is an enlarged layout view of a portion A of a peripheral area of the organic light emitting diode (OLED) display of FIG. 1. FIG. 5 is a cross-sectional view taken along the line V-V of FIG. 4.

Firstly, a structure of a pixel area of an organic light emitting diode (OLED) display according to the first exemplary embodiment will be described.

As shown in FIG. 2 and FIG. 3, the pixel area P of the display substrate 110 of the organic light emitting diode (OLED) display according to the first exemplary embodiment includes a switching thin film transistor 10, a driving thin film transistor 20, a storage capacitor 80, and an organic light emitting element 70 formed in each pixel. Also, the display substrate 110 further includes a gate line 121 disposed in one direction, and a data line 171 and a driving voltage line 172 insulated from and crossing the gate line 121.

The organic light emitting element 70 includes a pixel electrode 710, an organic emission layer 720 formed on the pixel electrode 710, and a common electrode 730 formed on the organic emission layer 720. Here, the pixel electrode 710 is an anode (+) electrode which is a hole injection electrode, and the common electrode 730 is a cathode (−) electrode which is an electron injection electrode. Holes and electrons are respectively injected from the pixel electrode 710 and the common electrode 730 into the organic emission layer 720, and form excitons. When the excitons change from an excited state to a base state, light is emitted.

The storage capacitor 80 includes a first storage plate 128 and a second storage plate 178 with an interlayer insulating layer 160 interposed therebetween. Herein, the interlayer insulating layer 160 becomes a dielectric. Storage capacity is determined by electric charges stored in the storage capacitor 80 and a voltage between the storage plates 128 and 178.

The switching thin film transistor 10 includes a switching semiconductor layer 131, a switching gate electrode 122, a switching source electrode 173, and a switching drain electrode 174. The driving thin film transistor 20 includes a driving semiconductor layer 132, a driving gate electrode 125, a driving source electrode 176, and a driving drain electrode 177.

The switching thin film transistor 10 is used as a switching element for selecting a pixel to emit light. The switching gate electrode 122 is coupled to the gate line 121. The switching source electrode 173 is coupled to the data line 171. The switching drain electrode 174 is spaced apart from the switching source electrode 173 and coupled to the first storage plate 128.

The driving thin film transistor 20 applies driving power for allowing the organic emission layer 720 of the organic light emitting diode 70 in the selected pixel to emit light to the pixel electrode 710. The driving gate electrode 125 is coupled to the first storage plate 128. The driving source electrode 176 and the second storage plate 178 are coupled to the driving voltage line 172. The driving drain electrode 177 is coupled to the first electrode 710 of the organic light emitting diode 70 through an electrode contact hole 189.

By this structure, the switching thin film transistor 10 is operated by a gate voltage applied to the gate line 121 to transmit a data voltage applied to the data line 171 to the driving thin film transistor 20. A voltage equivalent to a difference between a common voltage applied to the driving thin film transistor 20 from the driving voltage line 172, and the data voltage transmitted from the switching thin film transistor 10 is stored in the storage capacitor 80. A current corresponding to the voltage stored in the storage capacitor 80 flows to the organic light emitting diode 70 through the driving thin film transistor 20 to allow the organic light emitting diode 70 to emit light.

Hereinafter, the structure of the pixel in the pixel area of the organic light emitting diode display according to the first embodiment will be described according to a deposition sequence in detail with reference to FIG. 3.

A first substrate member 111 that forms the display substrate 110 may be formed of, for example, an insulating substrate that is made of glass, quartz, ceramic, plastic, and the like. A buffer layer 120 is disposed on the first substrate member 111. The buffer layer 120 prevents impurities from permeating and planarizes the surface, and may be formed of various materials that can perform these functions. The driving semiconductor layer 132 is disposed on the buffer layer 120. The driving semiconductor layer 132 may be formed of, for example, a polysilicon film. In addition, the driving semiconductor layer 132 includes a channel region 135 in which an impurity is not doped, and a source region 136 and a drain region 137 that are doped, e.g., p+ doped, at respective sides of the channel region 135. A gate insulating layer 140 that may be formed of, for example, silicon nitride (SiNx) or silicon oxide (SiO2) is disposed on the driving semiconductor layer 132. Gate wiring that includes the driving gate electrode 125 is disposed on the gate insulating layer 140. In addition, the gate wiring further includes the gate line 121, the first capacitor plate 128, and other wiring. Further, the driving gate electrode 125 is arranged so as to overlap at least a portion of the driving semiconductor layer 132, particularly the channel region 135.

The interlayer insulating layer 160 that covers the driving gate electrode 125 is disposed on the gate insulating layer 140. The gate insulating layer 140 and the interlayer insulating layer 160 have through-holes that expose the source region 136 and drain region 137 of the driving semiconductor layer 132. The interlayer insulating layer 160, like the gate insulating layer 140, may be made of, for example, a ceramic-based material such as silicon nitride (SiNx) or silicon oxide (SiO2).

The data wiring that includes the driving source electrode 176 and driving drain electrode 177 is disposed on the interlayer insulating layer 160. In addition, the data wiring further includes the data line 171, the driving voltage line 172, the second capacitor plate 178, and the other wiring. In addition, the driving source electrode 176 and driving drain electrode 177 are coupled to the source region 136 and drain region 137 of the driving semiconductor layer 132 through the through-holes that are disposed in the interlayer insulating layer 160 and gate insulating layer 140.

As described above, the driving thin film transistor 20 that includes the driving semiconductor layer 132, driving gate electrode 155, the driving source electrode 176, and the driving drain electrode 177 is provided. The constitution of the driving thin film transistor 20 is not limited to the above examples, but, as one of ordinary skill in the art would recognize, may be variously modified.

A protective layer 180 that covers the data wires 172, 176, 177, and 178 is disposed on the interlayer insulating layer 160. The protective layer 180 is configured to prevent damage to the data wiring in the etch process. The protective layer 180 has an electrode contact opening, e.g., electrode contact hole, 189 exposing a portion of the drain electrode 177.

The pixel electrode 710 of the organic light emitting element 70 is disposed on the protective layer 180. That is, the organic light emitting diode (OLED) display 100 includes a plurality of pixel electrodes 710 respectively disposed in a plurality of pixels. Here, the plurality of pixel electrodes 710 are disposed apart from each other. Each pixel electrode 710 is coupled to a drain electrode 177 through the electrode contact opening 189 of the protective layer 180.

In addition, a pixel defining layer 190 that has an opening that exposes the first electrode 710 is disposed on the protective layer 180. That is, the pixel defining layer 190 has a plurality of openings 191 in each pixel. In addition, the first electrode 710 is disposed so as to correspond to the opening 191 of the pixel defining layer 190. The organic emission layer 720 is disposed on the pixel electrode 710, and the common electrode 730 is disposed on the organic emission layer 720. As described above, the organic light emitting element 70 including the pixel electrode 710, the organic emission layer 720, and the common electrode 730 is provided.

The organic emission layer 720 may be formed of, for example, a low molecular weight organic material or a high molecular weight organic material. In addition, the organic emission layer 720 may be formed of, for example, a multi-layered structure that includes an emission layer, a hole injection layer (HIL), a hole transport layer (HTL), an electron transport layer (ETL), and an electron injection layer (EIL). In the case of when all of them are included, the hole injection layer (HIL) is disposed on the first electrode 710, i.e., the anode; and the hole transport layer (HTL), emission layer, electron transport layer (ETL), and electron injection layer (EIL) are sequentially layered thereon. The organic emission layer 720 may include a red organic emission layer 720R, a green organic emission layer 720G, and a blue organic emission layer 720B.

The pixel electrode 710 and the common electrode 730 may be formed of a transparent conductive material, respectively, or a semitransparent or reflective conductive material. Depending on the kind of the material that forms the pixel electrode 710 and the common electrode 730, the organic light emitting diode (OLED) display 100 may be a front side light-emitting type, a rear side light-emitting type or both sides light-emitting type.

The encapsulation substrate 210 is disposed on the common electrode 730 and faces the display substrate 110. The encapsulation substrate 210 is a substrate that covers at least the display area P in the display substrate 110 in which the organic light emitting element is disposed. In the case when it is a front surface light-emitting type or a both surface light-emitting type, it is formed of a transparent material such as glass or plastic, and in the case when it is a rear surface light-emitting type, it is formed of an opaque material such as a metal. This encapsulation substrate 210 has a plate shape.

Next, the structure of the peripheral area of the organic light emitting diode (OLED) display according to the first exemplary embodiment will be described.

As shown in FIG. 4, in the peripheral area Q of the display substrate 110 of the organic light emitting diode (OLED) display according to the first exemplary embodiment, a data driving line 179 on the same layer as the data line 171, and a getter 320 partially overlapping the common electrode 730 are disposed. The sealant 310 is disposed outside the getter 320. The data driving line 179 may be a driving voltage line such as a low potential power supply line ELVSS or a high potential power supply line ELVDD, and the data driving line 179 may be coupled to a low potential power supply pad 410 or a high potential power supply pad 420. A fan-out unit 127, which includes an extension line of the gate line 121 or a driving line of a surrounding electrostatic circuit, may be disposed on the same layer as the gate line 121 in the peripheral area Q of the display substrate 110.

Here, the data driving line 179 overlapping the getter 320 has a plurality of data openings, e.g., data holes, 17 filled with the getter 320. Accordingly, a sufficient amount of the getter 320 is filled in the data openings 17 such that the amount of the getter 320 is increased without increasing of the cell gap, thereby increasing the moisture absorption amount.

As shown in FIG. 5, the buffer layer 120 is disposed on the peripheral area Q of the first substrate member 111. In addition, the gate insulating layer 140 and the interlayer insulating layer 160 are disposed on the buffer layer 120, and the gate insulating layer 140 and the interlayer insulating layer 160 have a plurality of gate insulating layer openings, e.g., gate insulating layer holes, 14 and a plurality of interlayer insulating layer openings, e.g., interlayer insulating layer holes, 16 respectively overlapping the plurality of data openings 17. The data driving line 179 having the plurality of data openings 17 is disposed on the interlayer insulating layer 160.

The protective layer 180 covering the data driving line 179 and the interlayer insulating layer 160 are disposed on the data driving line 179, and the protective layer 180 has a plurality of protective layer openings 18, e.g., protective layer holes, overlapping the plurality of data openings 17. The pixel defining layer 190 is disposed on the protective layer 180, and the pixel defining layer 190 has a plurality of pixel defining layer openings 19, e.g., pixel defining layer holes, overlapping the plurality of data openings 17.

The getter 320 is disposed on the pixel defining layer 190 of the peripheral area Q. Additionally, the getter 320 fills in a plurality of getter openings 330. The plurality of getter openings, e.g., getter holes, includes, for example, the plurality of pixel defining layer openings 19, the plurality of protective layer openings 18, the plurality of data openings 17, the plurality of interlayer insulating layer openings 16, and the plurality of gate insulating layer openings 14.

The plurality of getter openings 330, including the plurality of pixel defining layer openings 19, the plurality of protective layer openings 18, the plurality of data openings 17, the plurality of interlayer insulating layer openings 16, and the plurality of gate insulating layer openings 14, have a suitable depth, e.g., a predetermined depth, such that the amount of the getter 320 may be increased, thereby increasing the moisture absorption amount.

In a case that the transverse length of the encapsulation substrate 210 of a typical organic light emitting diode (OLED) display is 122.6 cm, the longitudinal length is 69.6 cm, the total length of a coating of the getter 320 is 3884.4 cm, the coating width of the getter 320 is 4 mm, the cell gap is 20 μm, and the density of the getter 320 is 1.6 g/cm$^3$, the coating amount of the getter 320 is about 492 mg as a product of the coating area of the getter 320, the cell gap, and the density of the getter.

When measuring the additional getter coating amount in the case of forming the getter openings 330 according to one embodiment, for example, in a case of forming the getter openings 330 having a width of 300 μm with an interval of 1000 μm, the number of getter openings 330 in the organic light emitting diode (OLED) display is 122 in a horizontal direction and 69 in a vertical direction, and three getter openings 330 are formed in the coating width of the getter 320, such that about 1,146 getter openings 330 are formed.

Accordingly, the additional getter coating amount, as a product of the diameter of the getter openings 330, the depth (about 5.38 μm) of the getter openings 330, the number of getter openings 330, and the density of the getter, is about 6.97 mg. Accordingly, about 40% more getter may be formed in the organic light emitting diode (OLED) display such that the absorption amount of the moisture may be increased.

Additionally, the assistance gate metal overlapping the data driving line may be formed between the gate insulating layer and the interlayer insulating layer, and a plurality of gate openings, e.g., gate holes, overlapping the plurality of data openings may be in the assistance gate metal.

Hereafter, an organic light emitting diode (OLED) display according to a second exemplary embodiment will be described with reference to FIG. 6 and FIG. 7.

Figure 6:
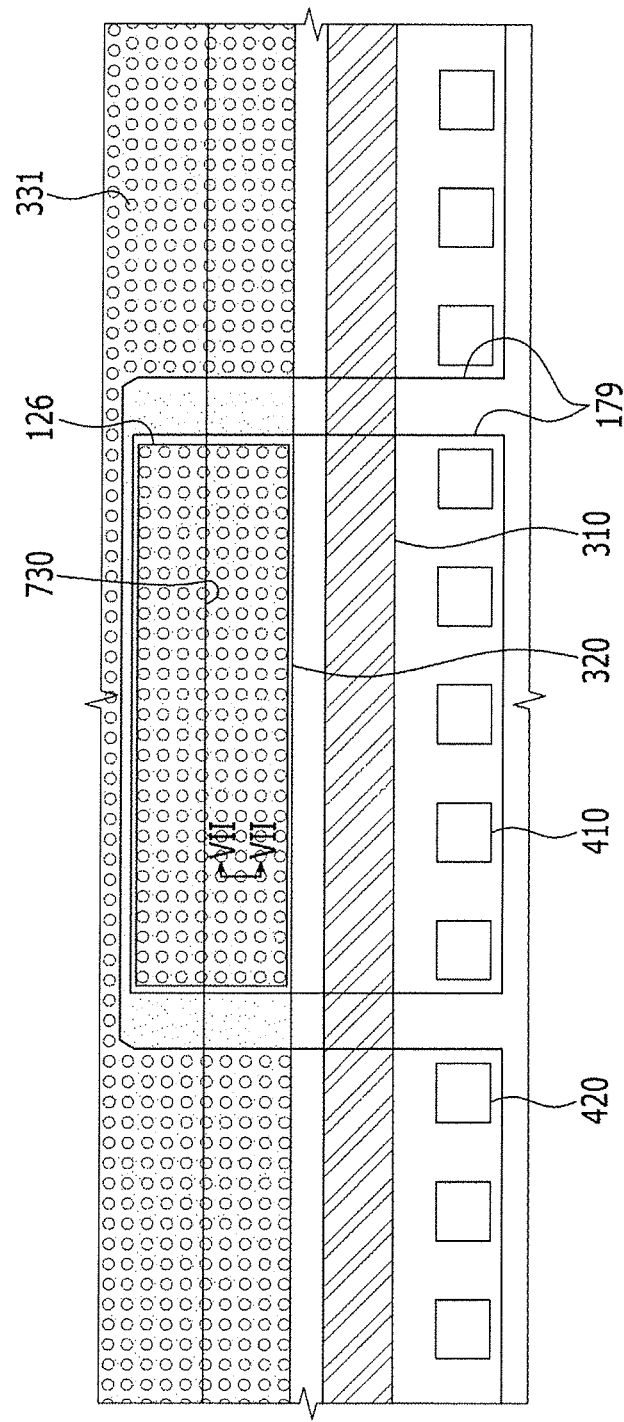

FIG. 6 is an enlarged layout view of a portion of a peripheral area of an organic light emitting diode (OLED) display according to the second exemplary embodiment. FIG. 7 is a cross-sectional view taken along the line VII-VII of FIG. 6.

The second exemplary embodiment is substantially equivalent to the first exemplary embodiment shown in FIGS. 1 to 5, except for a plurality of gate openings in an assistance gate metal such that repeated description is omitted.

Figure 7:
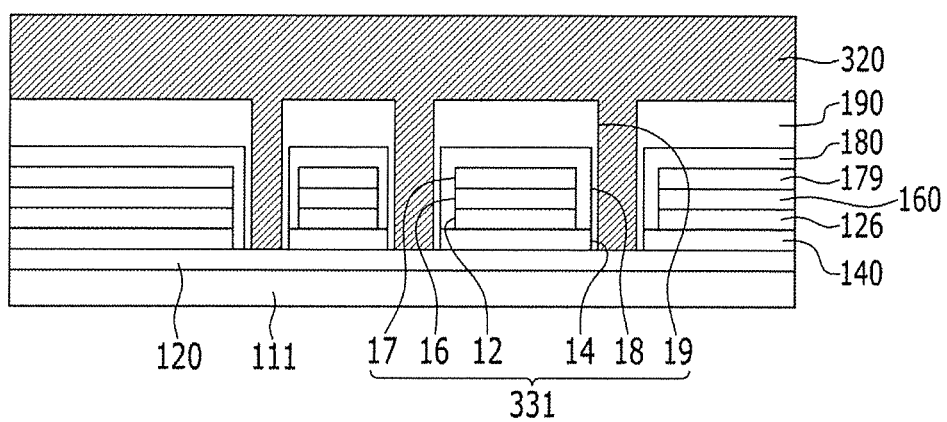

As shown in FIG. 6 and FIG. 7, in the organic light emitting diode (OLED) display according to a second exemplary embodiment, a buffer layer 120 is disposed on the peripheral area Q of the first substrate member 111. In addition, a gate insulating layer 140 is disposed on the buffer layer 120, and the gate insulating layer 140 has a plurality of gate insulating layer openings 14 overlapping a plurality of gate openings 12. The assistance gate metal 126 overlapping the data driving line 179 is disposed on the gate insulating layer 140. The assistance gate metal 126 has a plurality of gate openings 12 overlapping the plurality of data openings 17.

In addition, the interlayer insulating layer 160 is disposed on the gate insulating layer 140 and the gate driving line 129, and the interlayer insulating layer 160 has a plurality of interlayer insulating layer openings 16 overlapping the plurality of gate openings 12. The data driving line 179 having the plurality of data openings 17 is disposed on the interlayer insulating layer 160.

A protective layer 180 covering the data driving line 179 is disposed on the data driving line 179, and the protective layer 180 has a plurality of protective layer openings 18 overlapping the plurality of data openings 17. A pixel defining layer 190 is disposed on the protective layer 180, and the pixel defining layer 190 has a plurality of pixel defining layer openings 19 overlapping the plurality of data openings 17.

A getter 320 is disposed on the pixel defining layer 190 of the peripheral area Q. Additionally, the getter 320 fills in a plurality of getter openings 331. The plurality of getter openings includes, for example, the plurality of pixel defining layer openings 19, the plurality of protective layer openings 18, the plurality of data openings 17, the plurality of interlayer insulating layer openings 16, the plurality of gate openings 12, and the plurality of gate insulating layer openings 14.

The getter openings 331, including the plurality of pixel defining layer openings 19, the plurality of protective layer openings 18, the plurality of data openings 17, the plurality of interlayer insulating layer openings 16, the plurality of gate openings 12, and the plurality of gate insulating layer openings 14, have a suitable depth, e.g., a predetermined depth, such that the amount of the getter 320 may be increased, thereby increasing the moisture absorption amount. In this case, the cumulative depth is deeper by the added gate hole 12 compared with the getter openings 330 shown in FIG. 5 such that the amount of the getter may be increased, thereby further increasing the moisture absorption amount.

Additionally, a plurality of gate openings may be in the gate driving line.

Next, an organic light emitting diode (OLED) display according to a third exemplary embodiment will be described with reference to FIG. 8 and FIG. 9.

Figure 8:
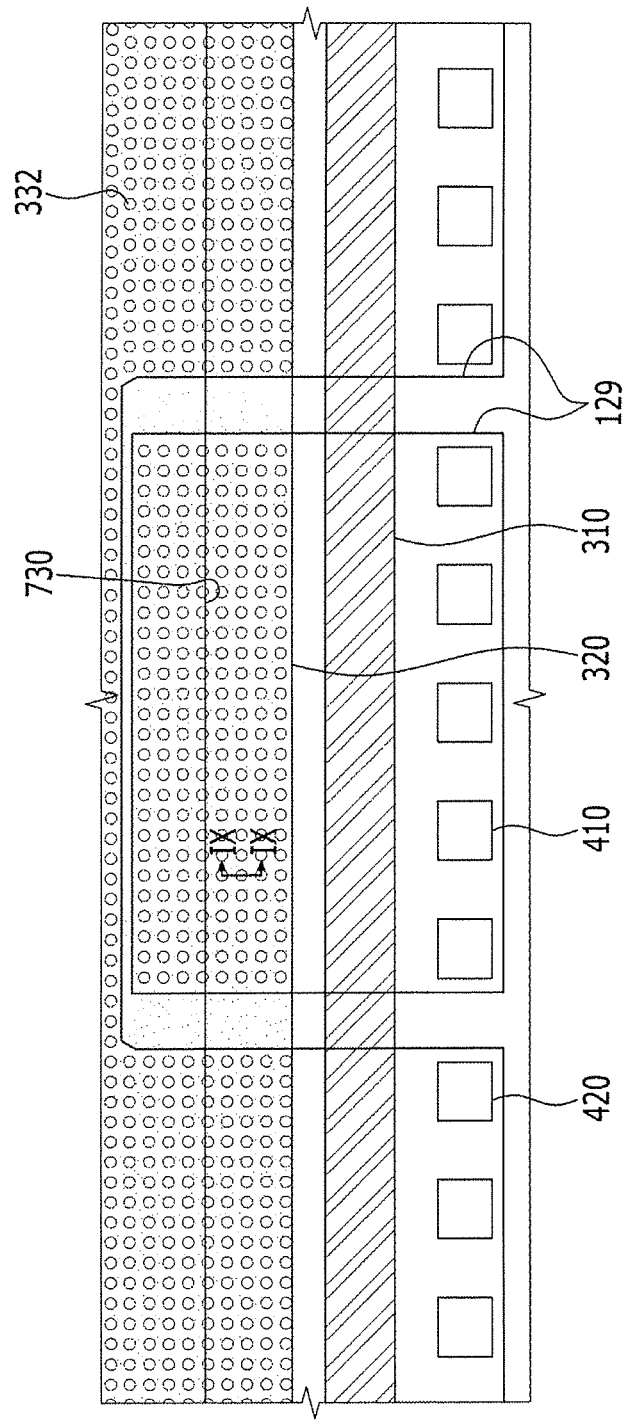
Figure 9:
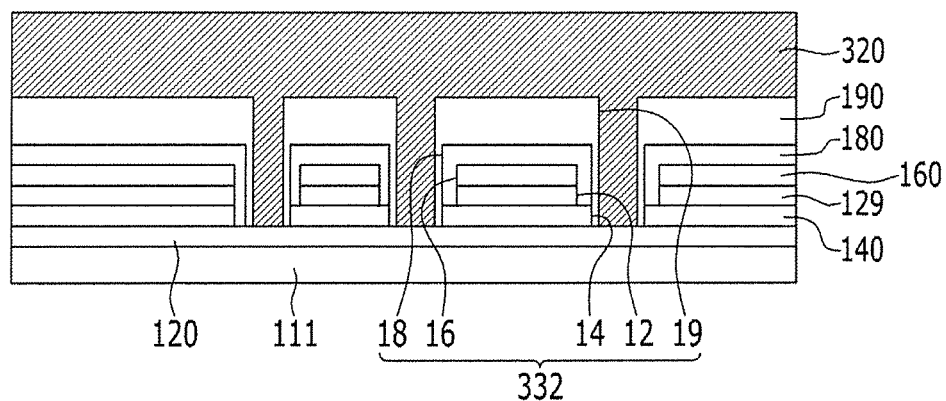

FIG. 8 is an enlarged layout view of a portion of a peripheral area of an organic light emitting diode (OLED) display according to the third exemplary embodiment, and FIG. 9 is a cross-sectional view taken along the line IX-IX of FIG. 8.

The third exemplary embodiment is substantially equivalent to the first exemplary embodiment shown in FIG. 1 to FIG. 5, except that the embodiment relates to the plurality of gate openings instead of the plurality of data openings, such that the repeated description is omitted.

As shown in FIG. 8 and FIG. 9, the peripheral area Q of the display substrate 110 of the organic light emitting diode (OLED) display according to the third exemplary embodiment includes a gate driving line 129 at the same layer as the gate 121, and a getter 320 partially overlapping the common electrode 730. A sealant 310 is disposed outside the getter 320. The gate driving line 129 may be the driving voltage line such as the low potential power supply line (ELVSS) or the high potential power supply line (ELVDD), and the gate driving line 129 may be coupled to the low potential power supply pad 410 or the high potential power supply pad 420.

A buffer layer 120 is disposed on the peripheral area Q of the first substrate member 111. In addition, a gate insulating layer 140 is disposed on the buffer layer 120, and the gate insulating layer 140 has a plurality of gate insulating layer openings 14 overlapping the plurality of gate openings 12. A gate driving line 129 having a plurality of gate openings 12 is disposed on the gate insulating layer 140.

Also, an interlayer insulating layer 160 is disposed on the gate insulating layer 140 and the gate driving line 129, and the interlayer insulating layer 160 has a plurality of interlayer insulating layer openings 16 overlapping a plurality of gate openings 12. A protective layer 180 is disposed on the interlayer insulating layer 160, and the protective layer 180 has a plurality of protective layer openings 18 overlapping the plurality of gate openings 12. A pixel defining layer 190 is disposed on the protective layer 180, and the pixel defining layer 190 has a plurality of pixel defining layer openings 19 overlapping the plurality of gate openings 12.

A getter 320 is disposed on the pixel defining layer 190 of the peripheral area Q. Additionally, the getter 320 fills in the plurality of getter openings 332. The plurality of getter openings 332 includes, for example, the plurality of pixel defining layer openings 19, the plurality of protective layer openings 18, the plurality of interlayer insulating layer openings 16, the plurality of gate openings 12, and the plurality of gate insulating layer openings 14.

The getter openings 332, including the plurality of pixel defining layer openings 19, the plurality of protective layer openings 18, the plurality of interlayer insulating layer openings 16, the plurality of gate openings 12, and the plurality of gate insulating layer openings 14, have a suitable depth, e.g., a predetermined depth, such that the amount of the getter may be increased, thereby increasing the moisture absorption amount.

Alternatively, the protective layer having the plurality of protective layer openings may not be disposed in the peripheral area.

Next, an organic light emitting diode (OLED) display according to a fourth exemplary embodiment will be described with reference to FIG. 10.

Figure 10:
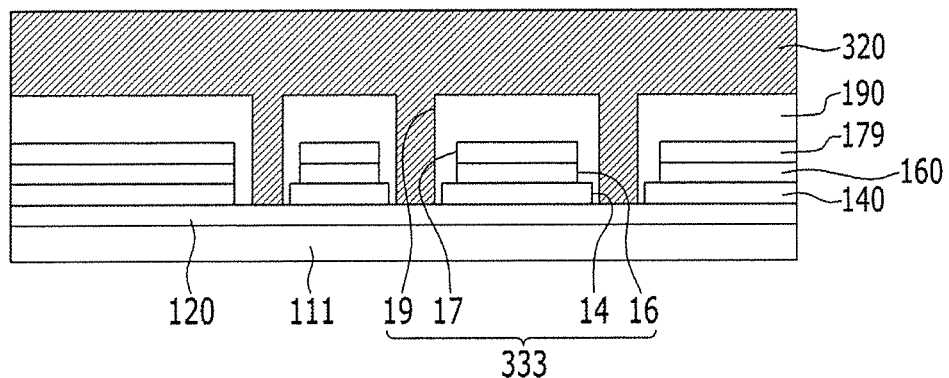

FIG. 10 is a cross-sectional view of a peripheral area of an organic light emitting diode (OLED) display according to the fourth exemplary embodiment.

The fourth exemplary embodiment is substantially equivalent to the first exemplary embodiment shown in FIG. 4 and FIG. 5, except for a structure in which the protective layer openings are not disposed, such that the repeated description is omitted.

As shown in FIG. 10, in the organic light emitting diode (OLED) display according to the fourth exemplary embodiment, the data driving line 179 overlapping the getter 320 has a plurality of data openings 17 filled with the getter 320.

Also, a buffer layer 120 is disposed on the peripheral area Q of the first substrate member 111. In addition, the gate insulating layer 140 and the interlayer insulating layer 160 are disposed on the buffer layer 120, and the gate insulating layer 140 and the interlayer insulating layer 160 have the plurality of gate insulating layer openings 14 and the plurality of interlayer insulating layer openings 16 overlapping the plurality of data openings 17. A data driving line 179 having the plurality of data openings 17 is disposed on the interlayer insulating layer 160.

A pixel defining layer 190 covering the data driving line 179 and the interlayer insulating layer 160 is disposed on the data driving line 179, and the pixel defining layer 190 has a plurality of pixel defining layer openings 19 overlapping the plurality of data openings 17.

A getter 320 is disposed on the pixel defining layer 190 of the peripheral area Q. Additionally, the getter 320 fills in a plurality of getter openings 333. The plurality of getter openings includes, for example, the plurality of pixel defining layer openings 19, the plurality of data openings 17, the plurality of interlayer insulating layer openings 16, and the plurality of gate insulating layer openings 14.

The plurality of getter openings 333, including the plurality of pixel defining layer openings 19, the plurality of data openings 17, the plurality of interlayer insulating layer openings 16, and the plurality of gate insulating layer openings 14, have a suitable depth, e.g., a predetermined depth, such that the amount of the getter may be increased, thereby increasing the moisture absorption amount.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims, and their equivalents.

| Description of Some of the Reference Numerals | |
|---|---|
| 330: getter opening | 12: gate opening |
| 14: gate insulating layer opening | 16: interlayer insulating layer opening |
| 18: protective layer opening | 19: pixel defining layer opening |
| 110: substrate | 126: assistance gate metal |
| 129: gate driving line | 140: gate insulating layer |
| 160: interlayer insulating layer | 179: data driving line |
| 180: protective layer | 190: pixel defining layer |

What is claimed is:

1. An organic light emitting diode (OLED) display comprising:
   a substrate including a pixel area at which a pixel for emitting light is located, and a peripheral area around the pixel area;
   a gate line located in the pixel area;
   a data line insulated from and crossing the gate line;
   a data driving line located in the peripheral area and being located at a same layer as the data line;
   a pixel electrode coupled to the data line;
   an organic light emitting layer on the pixel electrode;
   a common electrode on the organic light emitting layer;
   a getter at the peripheral area and partially overlapping the common electrode; and
   a sealant surrounding the getter,
   wherein the data driving line overlapping the getter has a plurality of data openings filled with the getter, and the sealant surrounds the data openings filled with the getter.

2. The organic light emitting diode (OLED) display of claim 1, further comprising:
   a gate insulating layer and an interlayer insulating layer sequentially arranged between the substrate and the data driving line,
   the gate insulating layer and the interlayer insulating layer respectively having a plurality of gate insulating layer openings and a plurality of interlayer insulating layer openings overlapping the plurality of data openings.

3. The organic light emitting diode (OLED) display of claim 2, further comprising:
   a protective layer on the data driving line,
   the protective layer having a plurality of protective layer openings overlapping the plurality of data openings.

4. The organic light emitting diode (OLED) display of claim 3, further comprising:
   a pixel defining layer on the protective layer,
   the pixel defining layer having a plurality of pixel defining layer openings overlapping the plurality of data openings.

5. The organic light emitting diode (OLED) display of claim 4, further comprising:
   an assistance gate metal positioned between the gate insulating layer and the interlayer insulating layer and overlapping the data driving line,
   the assistance gate metal having a plurality of gate openings overlapping the plurality of data openings.

6. The organic light emitting diode (OLED) display of claim 2, further comprising:
   a pixel defining layer on the data driving line,
   the pixel defining layer having a plurality of protective layer openings overlapping the plurality of data openings.

7. The organic light emitting diode (OLED) display of claim 1, wherein
   the data driving line comprises a driving voltage line.

8. The organic light emitting diode (OLED) display of claim 1, further comprising:
   a gate driving line in the peripheral area and being located at a same layer as the gate line,
   the gate driving line overlapping the getter and having a plurality of gate openings filled with the getter.

9. The organic light emitting diode (OLED) display of claim 8, further comprising:
   a gate insulating layer between the substrate and the gate driving line,
   the gate insulating layer having a plurality of gate insulating layer openings overlapping the plurality of gate openings.

10. The organic light emitting diode (OLED) display of claim 9, further comprising:
    an interlayer insulating layer and a protective layer sequentially arranged on the gate driving line, the interlayer insulating layer and the protective layer respectively having a plurality of interlayer insulating layer openings and a plurality of protective layer openings overlapping the plurality of gate openings.

11. The organic light emitting diode (OLED) display of claim 10, further comprising:
    a pixel defining layer on the protective layer,
    the pixel defining layer having a plurality of pixel defining layer openings overlapping the plurality of gate openings.

12. The organic light emitting diode (OLED) display of claim 8, wherein
    the gate driving line comprises a driving voltage line.

13. The organic light emitting diode (OLED) display of claim 1, wherein the common electrode has a plurality of getter openings filled with the getter at a portion where the getter partially overlaps the common electrode.

* * * * *